(12) United States Patent
Shi et al.

(10) Patent No.: US 8,026,142 B2
(45) Date of Patent: Sep. 27, 2011

(54) METHOD OF FABRICATING SEMICONDUCTOR TRANSISTOR DEVICES WITH ASYMMETRIC EXTENSION AND/OR HALO IMPLANTS

(75) Inventors: Zhonghai Shi, Austin, TX (US); Jingrong Zhou, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 214 days.

(21) Appl. No.: 12/463,221

(22) Filed: May 8, 2009

(65) Prior Publication Data
US 2010/0285650 A1 Nov. 11, 2010

(51) Int. Cl.
H01L 21/00 (2006.01)
(52) U.S. Cl. .......................... 438/279; 438/286; 438/302
(58) Field of Classification Search .................. 438/279, 438/302–305, 286
See application file for complete search history.

(56) References Cited

U.S. PATENT DOCUMENTS 6,440,803 B1 * 8/2002 Huang et al. .................. 438/276
2001/0018251 A1 * 8/2001 Tran .............................. 438/279

* cited by examiner

*Primary Examiner* — Richard A. Booth
(74) *Attorney, Agent, or Firm* — Ingrassia Fisher & Lorenz, P.C.

(57) ABSTRACT

A method of fabricating semiconductor devices begins by providing or fabricating a device structure that includes a semiconductor material and a plurality of gate structures formed overlying the semiconductor material. The method continues by creating light dose extension implants in the semiconductor material by bombarding the device structure with ions at a non-tilted angle relative to an exposed surface of the semiconductor material. During this step, the plurality of gate structures are used as a first implantation mask. The method continues by forming a patterned mask overlying the semiconductor material, the patterned mask being arranged to protect shared drain regions of the semiconductor material and to leave shared source regions of the semiconductor material substantially exposed. Thereafter, the method creates heavy dose extension implants and/or halo implants in the semiconductor material by bombarding the device structure with ions at a tilted angle relative to the exposed surface of the semiconductor material, and toward the plurality of gate structures. During this step, the plurality of gate structures and the patterned mask are used as a second implantation mask.

17 Claims, 10 Drawing Sheets

METHOD OF FABRICATING SEMICONDUCTOR TRANSISTOR DEVICES WITH ASYMMETRIC EXTENSION AND/OR HALO IMPLANTS

TECHNICAL FIELD

The subject matter described herein relates generally to the fabrication of semiconductor devices. More particularly, the subject matter relates to the fabrication of asymmetric transistor devices.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. Some transistor devices are intentionally fabricated with asymmetric characteristics to improve their performance. For example, a known fabrication process results in asymmetric extension and/or halo implants in the source and drain regions. In particular, the extension implant in the source region extends further toward or into the channel region, relative to the extension implant in the drain region. Moreover, it may be desirable to use halo implants only in the source region. Such asymmetric fabrication techniques can result in better DC performance (reduction in parasitic resistance, improved mobility, etc.) and better AC performance (less Miller capacitance at the drain side, less junction capacitance at the drain side, etc.). In turn, the power and speed characteristics of the transistor device are improved.

Asymmetric extension and halo implants are typically created using photolithographic techniques, angled ion implantation, and related process steps. Unfortunately, existing photolithography tools are not suitable for modern small-scale process node technology, e.g., 32 nm or 22 nm nodes, which can be used to create gate structures having a pitch of only 130 nm or less. Asymmetric extension and/or halo implants are very difficult (if not impossible) to create in transistor devices fabricated using 32 nm node technology because the narrow gate pitch, photoresist height restrictions, photoresist feature tolerances, ion implantation tilt angle, and other factors introduce geometric limitations that prevent the desired implantation profiles.

BRIEF SUMMARY

A method of fabricating semiconductor devices is provided. The method involves the fabrication of a device structure comprising a semiconductor material and a plurality of gate structures formed overlying the semiconductor material. The method also creates light dose extension implants in the semiconductor material, using the plurality of gate structures as a first implantation mask, by bombarding the device structure with ions at a non-tilted angle relative to an exposed surface of the semiconductor material. Then, the method forms a patterned mask overlying the semiconductor material, the patterned mask being arranged to protect shared drain regions of the semiconductor material and to leave shared source regions of the semiconductor material substantially exposed. The method continues by producing heavy dose extension implants in the semiconductor material, using the plurality of gate structures and the patterned mask together as a second implantation mask, by bombarding the device structure with ions at a tilted angle relative to the exposed surface of the semiconductor material, and toward the plurality of gate structures.

Another method of fabricating semiconductor devices is also provided. This method begins by providing a device structure comprising a semiconductor material and a plurality of gate structures formed overlying the semiconductor material. The method continues by creating light dose extension implants in the semiconductor material, using the plurality of gate structures as a first implantation mask, by bombarding the device structure with ions at a non-tilted angle relative to a reference surface of the semiconductor material. The method then forms a patterned mask overlying the semiconductor material, the patterned mask being arranged to protect shared drain regions of the semiconductor material and to leave shared source regions of the semiconductor material substantially exposed. Thereafter, the method forms halo implants in the semiconductor material, using the plurality of gate structures and the patterned mask together as a second implantation mask, by bombarding the device structure with ions at a tilted angle relative to the reference surface of the semiconductor material, and toward the plurality of gate structures.

Also provided is a method of fabricating a semiconductor device having adjacent transistor devices that share active regions. This method begins by providing a device structure comprising a semiconductor material, a plurality of gate structures formed overlying the semiconductor material, a shared source region of the semiconductor material, which underlies a first space defined between a first gate structure of the plurality of gate structures and a second gate structure of the plurality of gate structures, and a shared drain region of the semiconductor material, which underlies a second space defined between the second gate structure and a third gate structure of the plurality of gate structures, the second gate structure being adjacent to the first gate structure, and the third gate structure being adjacent to the second gate structure. The method proceeds by implanting a relatively light impurity dose into the semiconductor material while using the plurality of gate structures as a first implantation mask, resulting in light dose extension implants in the shared source region and in the shared drain region. The method continues by protecting the shared drain region with a first patterned mask that leaves the shared source region substantially exposed, and by implanting a relatively high impurity dose into the semiconductor material while using the plurality of gate structures and the first patterned mask together as a second implantation mask, by bombarding the shared source region with ions of an impurity species at a tilted angle and toward the second gate structure. This results in a heavy dose extension implant in the shared source region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
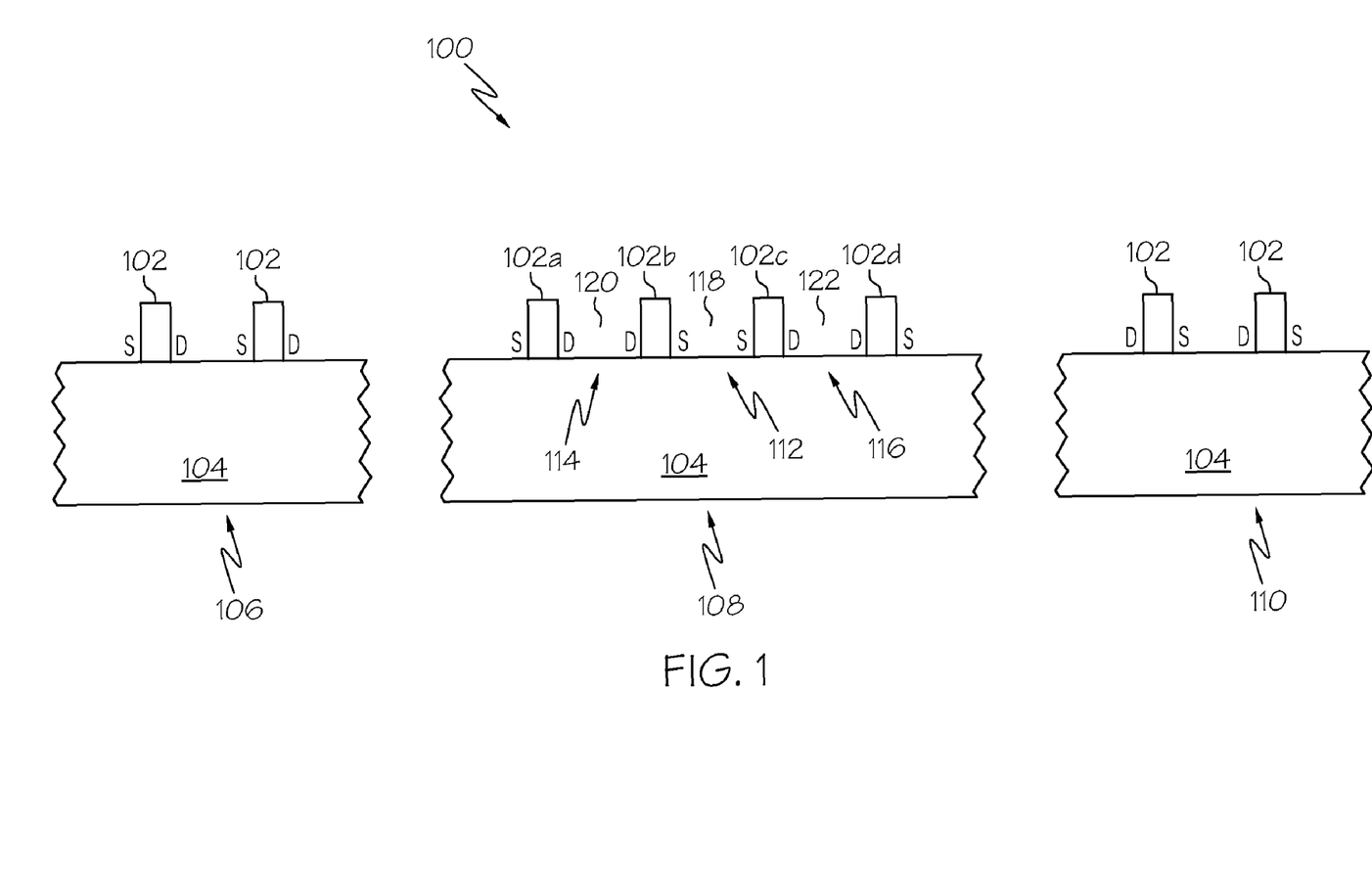
FIGS. 1-9 are cross sectional views that illustrate an exemplary semiconductor device structure and a method of fabricating it.

The process steps described here can be utilized in conjunction with any semiconductor device fabrication process that forms gate structures for transistors. The fabrication process described here can be used to create NMOS transistors, PMOS transistors, or a combination of NMOS and PMOS transistors on a common substrate. FIG. 1 depicts the fabrication state of a device structure 100 after formation of a plurality of gate structures 102 overlying a semiconductor material 104. Semiconductor material 104 is preferably a silicon material as typically used in the semiconductor industry, e.g., relatively pure silicon as well as silicon admixed with other elements such as germanium, carbon, and the like. Alternatively, semiconductor material 104 can be germanium, gallium arsenide, or the like. Semiconductor material 104 can be either N-type or P-type, but is typically P-type, with wells of the appropriate type formed therein. Semiconductor material 104 may be provided as a bulk semiconductor substrate, or it could be provided on a silicon-on-insulator (SOI) substrate, which includes a support substrate, an insulator layer on the support substrate, and a layer of silicon material on the insulator layer.

FIG. 1 depicts three sections of device structure 100: a left section 106; a middle section 108; and a right section 110. These sections represent different areas of device structure 100, formed on the same wafer and formed using the same semiconductor material 104. These (and other sections) of device structure 100 can be isolated from each other using known isolation or insulation techniques, such as shallow trench isolation. For clarity and ease of illustration, the three sections are depicted separately even though they are actually physically coupled together, and isolation regions are not shown in FIG. 1. For simplicity, the left section 106 is shown with only two gate structures 102, the middle section 108 is shown with only four gate structures 102, and the right section 110 is shown with only two gate structures 102. In practice, each section may contain many more gate structures 102. The significance of the different sections will be explained later in this description.

Gate structures 102 are formed using known process steps, e.g., material deposition, photolithography, etching, cleaning, and the like. Although not separately shown in FIG. 1, each of the gate structures 102 includes a gate insulator layer overlying the semiconductor material 104, and a gate electrode material (typically polycrystalline silicon) overlying the gate insulator layer. Each of the gate structures 102 may, but need not, include a cap layer formed from an insulating material such as silicon nitride. In practice, each of the gate structures 102 will have a very thin layer of sidewall material (e.g., an oxide material) formed thereon. In certain embodiments, gate structures 102 are arranged in a uniform and regular pattern across the wafer. In this regard, the pitch of the gate structures 102 (i.e., the center-to-center distance between adjacent gate structures 102, or the width of any of the gate structures 102 plus the distance between adjacent gate structures 102) is constant. For example, a 32 nm node technology can achieve a gate pitch of 130 nm, with 90 nm spaces between adjacent gate structures 102.

For the illustrated example, the left section 106 will be utilized to create transistors that do not share active regions. In other words, the source and drain regions of the transistors in the left section 106 are separate and distinct. Moreover, the transistors in the left section 106 will be arranged with their source regions to the left of the gate structures 102, and with their drain regions to the right of the gate structures 102 (as viewed from the perspective of FIG. 1). The "S" and "D" labels in FIG. 1 indicate this intended arrangement. The right section 110 will also be utilized to create transistors having non-shared source and drain regions. However, the transistors in the right section 110 will be arranged with their drain regions to the left of the gate structures 102, and with their source regions to the right of the gate structures 102.

Unlike the arrangements of the left section 106 and the right section 110, the middle section 108 will be utilized to create transistors that have shared active regions. In this regard, the middle section 108 includes a shared source region 112 of the semiconductor material 104, and two shared drain regions 114/116 of the semiconductor material 104. The shared source region 112 underlies a space 118 that is defined between the gate structure 102b and the gate structure 102c, the shared drain region 114 underlies a space 120 that is defined between the gate structure 102a and the gate structure 102b, and the shared drain region 116 underlies a space 122 that is defined between the gate structure 102c and the gate structure 102d. As is clear from FIG. 1, the gate structure 102b is adjacent to the gate structure 102a, the gate structure 102c is adjacent to the gate structure 102b, and the gate structure 102d is adjacent to the gate structure 102c. Thus, adjacent transistor devices will share active regions, and the middle section 108 includes an alternating arrangement of shared source regions and shared drain regions. The "S" and "D" labels in FIG. 1 indicate this shared arrangement of active regions.

Figure 2:
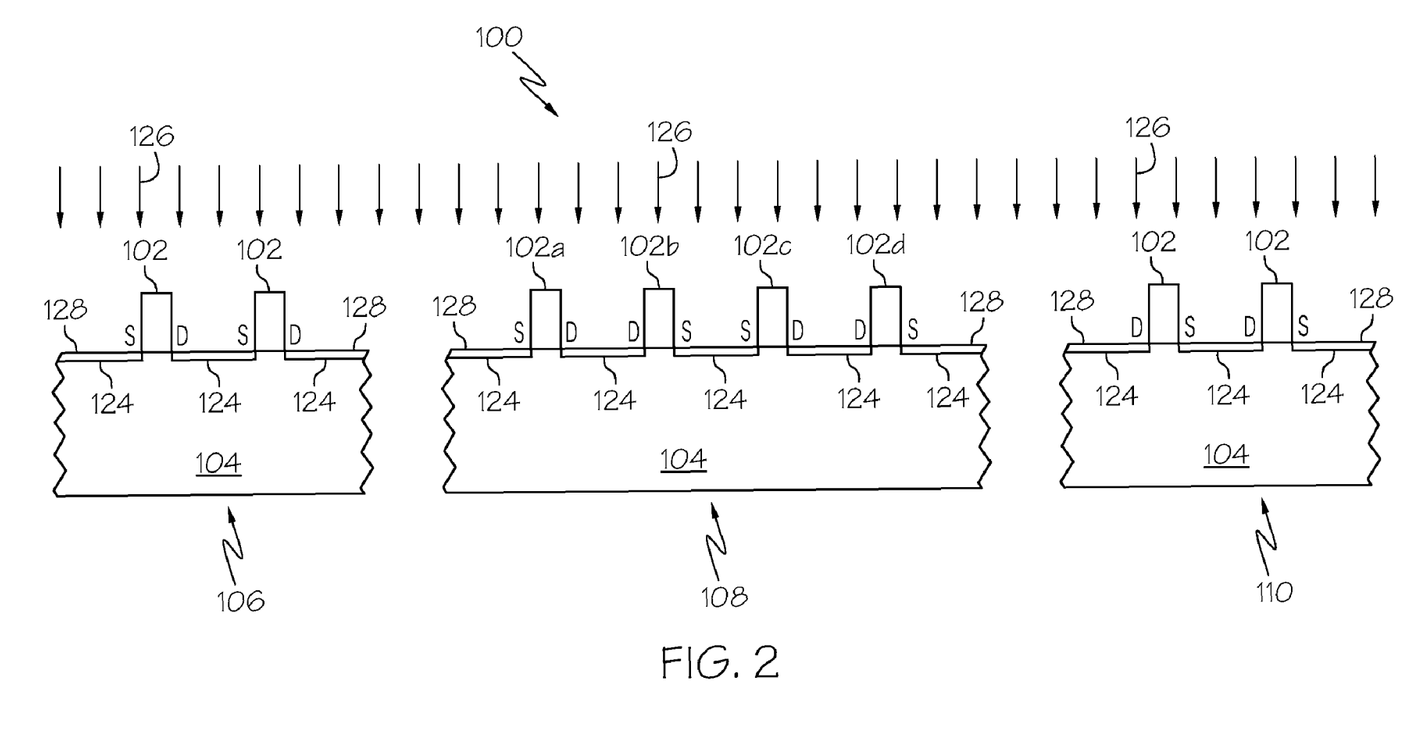

Although other fabrication steps or sub-processes may be performed after device structure 100 has been created, this example continues by creating light dose extension implants 124 in the semiconductor material 104. FIG. 2 depicts the state of the device structure 100 during the formation of the light dose extension implants 124 (for the sake of clarity, the labels for the shared active regions and spaces between adjacent gate structures have been omitted). As shown in FIG. 2, the light dose extension implants 124 are formed in the areas corresponding to the source regions, the drain regions, the shared source regions, and the shared drain regions of the semiconductor material 104.

For the illustrated embodiment, the light dose extension implants 124 are formed by implanting appropriate conductivity-determining ions of an impurity species into the semiconductor material 104, using the gate structures 102 as an implantation mask. Although not shown, a well mask may also be utilized to protect certain areas of the wafer from the ion implantation during this step. In FIG. 2, the arrows 126 (only three of which are specifically labeled) represent the ions that are implanted into the semiconductor material 104 during this step. Notably, the light dose extension implants 124 are created by bombarding the device structure 100 with the ions oriented at a non-tilted angle relative to the exposed surface 128 of the semiconductor material 104 (or relative to any appropriate reference surface of the semiconductor material 104). For this particular example, the implantation angle of the ions is orthogonal to the exposed surface 128 of the semiconductor material 104. Consequently, the light dose extension implants 124 are formed such that they are self-aligned with the edges (sidewalls) of the gate structures 102.

For NMOS transistors, the light dose extension implants 124 can be formed by implanting phosphorus ions into the semiconductor material 104. For PMOS transistors, the light dose extension implants 124 can be formed by implanting boron ions into the semiconductor material 104. The light dose extension implants 124 represent a relatively low percentage of a total extension implant dose for the device structure 100; the total extension implant dose for typical implementations will be within the range of about $1 \times 10^{14}$ cm$^{-3}$ to $2 \times 10^{15}$ cm$^{-3}$. Thus, the creation of the light dose extension implants 124 corresponds to the implanting of a relatively light impurity dose that is less than half of the total extension implant dose (preferably, between 10% to 40% of the total extension implant dose, and about 33% of the total extension implant dose in certain embodiments). Notably, this non-tilted light dose extension implantation step is decoupled from any tilted ion implant step (described below).

Figure 3:
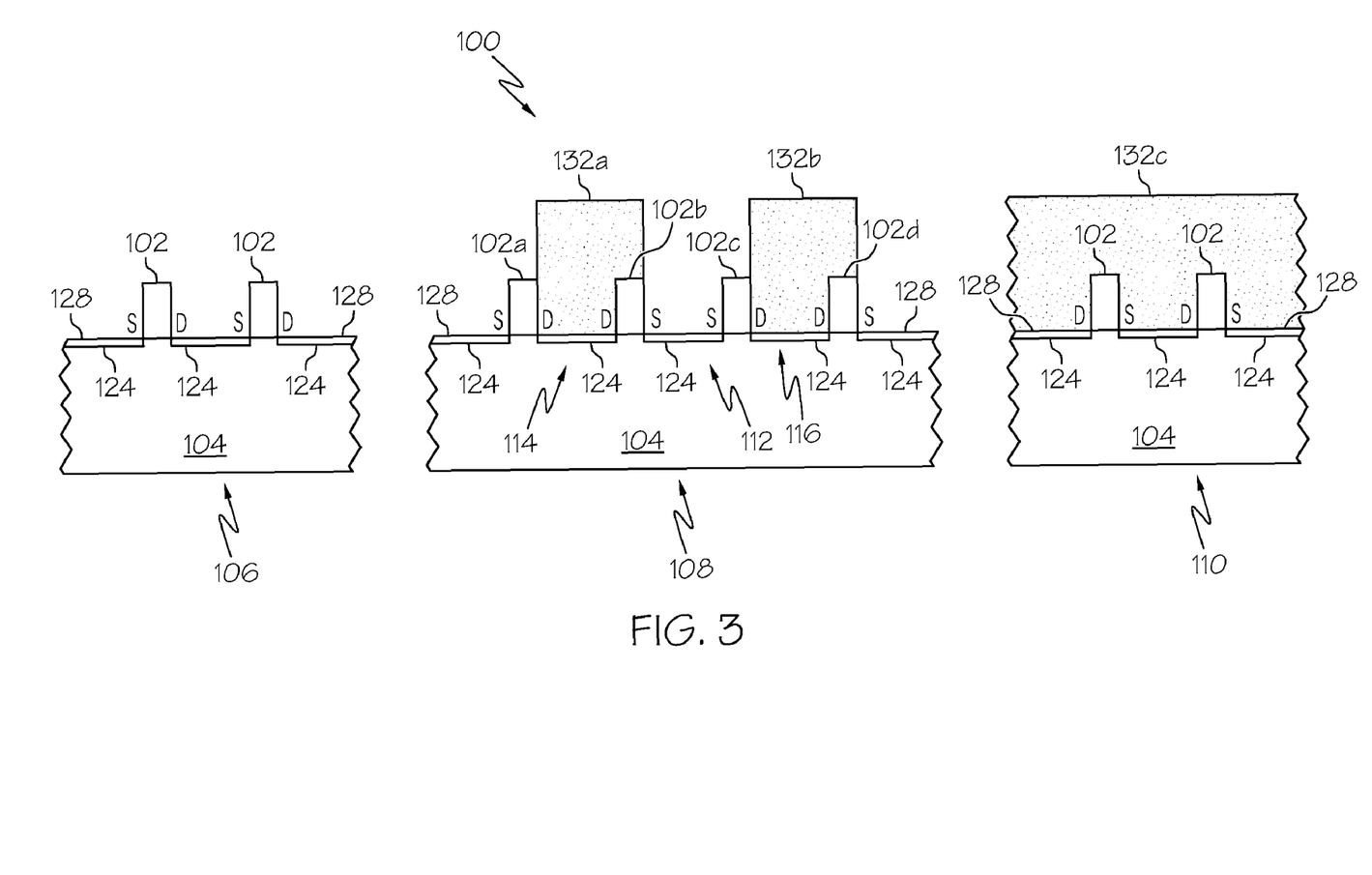

Although other fabrication steps or sub-processes may be performed after the formation of the light dose extension implants 124, this example continues by forming a patterned mask 132 that overlies selective portions of the semiconductor material 104 (see FIG. 3). Notably, the patterned mask 132 is distinct from and different than any well mask that is used to create the light dose extension implants 124. The patterned mask 132 serves to protect certain areas and regions of the semiconductor material 104, while leaving other areas and regions substantially (or completely) exposed. The patterned mask 132 may be formed from an appropriate photoresist material that has been treated in a conventional manner using well-known photolithography techniques. For example, patterned mask 132 can be created by depositing a layer of photoresist material over the exposed features of device structure 100, exposing the photoresist material using a photomask having an appropriate pattern defined therein, and developing the exposed photoresist material to selectively remove portions of the photoresist material. In practice, the patterned mask 132 is formed such that its height above the exposed surface 128 of the semiconductor material 104 is no greater than 250 nm. That said, the actual allowable height may vary, depending upon the implant energy and other design considerations.

FIG. 3 depicts device structure 100 after the patterned mask 132 has been developed. For the illustrated example, a section of the patterned mask 132c completely covers the right section 110 of the device structure 100, but the left section 106 of the device structure 100 remains fully exposed. Moreover, the patterned mask 132 is suitably arranged to protect the shared drain regions of the semiconductor material 104, and to leave the shared source regions of the semiconductor material 104 substantially exposed. In certain embodiments, the patterned mask 132 covers most of the shared drain regions 114/116, at least partially covers the gate structure 102b, and at least partially covers the gate structure 102d. In this example of a nominal configuration, a section of the patterned mask 132a completely covers the shared drain region 114 with mask material, and a section of the patterned mask 132b completely covers the shared drain region 116 with mask material. Notably, the patterned mask 132 can be arranged such that the shared source region 112 is completely exposed. For the illustrated embodiment, the section of the patterned mask 132a fully protects the shared drain region 114, completely covers the gate structure 102b, and covers little or no portion of the gate structure 102a. Similarly, the section of the patterned mask 132b fully protects the shared drain region 116, completely covers the gate structure 102d, and covers little or no portion of the gate structure 102c. This particular arrangement and orientation of the patterned mask 132 is not arbitrary. Rather, the patterned mask 132 is arranged in this manner to maximize the exposed space between the mask material such that subsequent titled ion implants for the source regions can reach the desired locations and areas of the semiconductor material 104, while preventing those tilted ion implants from reaching the drain regions.

Figure 4:
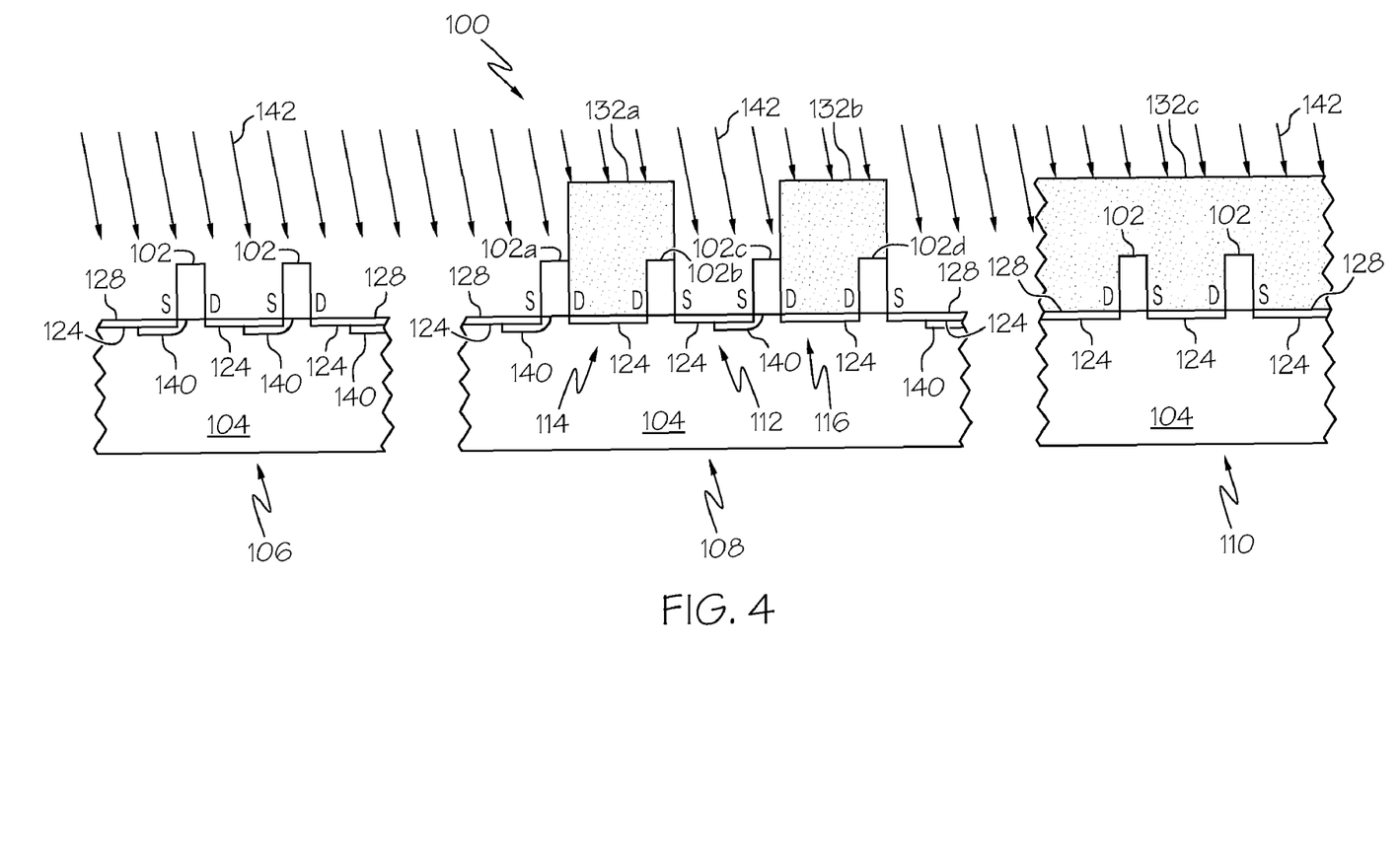

Although other fabrication steps or sub-processes may be performed after creating the patterned mask 132, this example continues by producing heavy dose extension implants 140 in the semiconductor material 104. FIG. 4 depicts the state of the device structure 100 during the creation of the heavy dose extension implants 140. As shown in FIG. 4, the heavy dose extension implants 140 are formed in some of the source regions of the device structure 100. The creation of the heavy dose extension implants 140 is decoupled from the creation of the light dose extension implants 124. In this regard, different ion implantation masks are used to create the heavy and light dose extension implants, and two different ion implantation steps are executed.

For the illustrated embodiment, the heavy dose extension implants 140 are formed by implanting appropriate conductivity-determining ions of an impurity species into the semiconductor material 104, using the gate structures 102 and the patterned mask 132 together as an implantation mask. In FIG. 4, the arrows 142 (only three of which are specifically labeled) represent the ions that are implanted into the semiconductor material 104 during this step. Notably, the heavy dose extension implants 140 are created by bombarding the device structure 100 with the ions oriented at a tilted angle relative to the exposed surface 128 of the semiconductor material 104 (or relative to any appropriate reference surface of the semiconductor material 104). Equivalently, the tilted angle could be measured relative to the vertical sidewalls of the gate structures 102. In practice, the implantation angle of the ions during this step is relatively low as measured from the sidewalls, e.g., within the range of six to eleven degrees. Notably, the ions are directed at an angle toward the gate structures (as depicted in FIG. 4) such that the ions are implanted into the source regions of the semiconductor material 104. More specifically, the ions are directed toward the left sides of the gate structures 102.

For NMOS transistors, the heavy dose extension implants 140 can be formed by implanting phosphorus ions into the semiconductor material 104. For PMOS transistors, the heavy dose extension implants 140 can be formed by implanting boron ions into the semiconductor material 104. The heavy dose extension implants 140 represent a relatively high percentage of the total extension implant dose for the device structure 100. Thus, the creation of the heavy dose extension implants 140 corresponds to the implanting of a relatively high impurity dose that is greater than half of the total extension implant dose (preferably, between 60% to 90% of the total extension implant dose, and about 67% of the total extension implant dose in certain embodiments).

Referring to the left section 106 of the device structure 100, the left-to-right alternating arrangement of source regions and drain regions results in asymmetric heavy dose extension implants 140. The gate structures 102 of the left section 106 serve as "shadowing" features that block the tilted ion implants from reaching the drain regions of the left section 106. Thus, even though the patterned mask 132 includes no features overlying the left section 106, the desired asymmetry is achieved. Referring to the right section 110 of the device structure 100, however, the right-to-left alternating arrangement of source regions and drain regions requires protection by the section of the patterned mask 132c. Without the section of the patterned mask 132c, the drain regions of the right section 110 would be implanted during the heavy dose implantation step. This explains the need for the section of the patterned mask 132c, which completely covers the right section 110.

Referring to the middle section 108 of the device structure 100, the shared source region 112 (and other source regions) remain exposed, while the shared drain regions 114/116 are protected by the patterned mask 132. FIG. 4 depicts an ideal patterned mask 132 that completely covers shared drain regions 114/116, completely covers gate structures 102b/102d, and does not overlap any portion of gate structures 102a/102c. This ideal configuration and height of the patterned mask 132 allows the tilted ion bombardment to reach the desired source regions of the semiconductor material 104, as depicted in FIG. 4. Notably, even if 32 nm node technology is used to create the device structure 100, the patterned mask 132 exposes the full available gate-to-gate space (e.g., 90 nm) above the shared source region 112.

For the illustrated example, the heavy dose extension implants 140 are associated with "source left" transistors. In other words, each heavy dose extension implant 140 is formed in a source region that is on the left side of the respective gate structure, as viewed from the perspective of the figures. In contrast, "source right" transistors do not receive heavy dose extension implants at this point in the process. For example, the source regions corresponding to gate structures 102b/102d (on the middle section 108 of the device structure 100) are not implanted during this step. Likewise, none of the source regions on right section 110 of the device structure 100 are implanted during this step.

Figure 5:
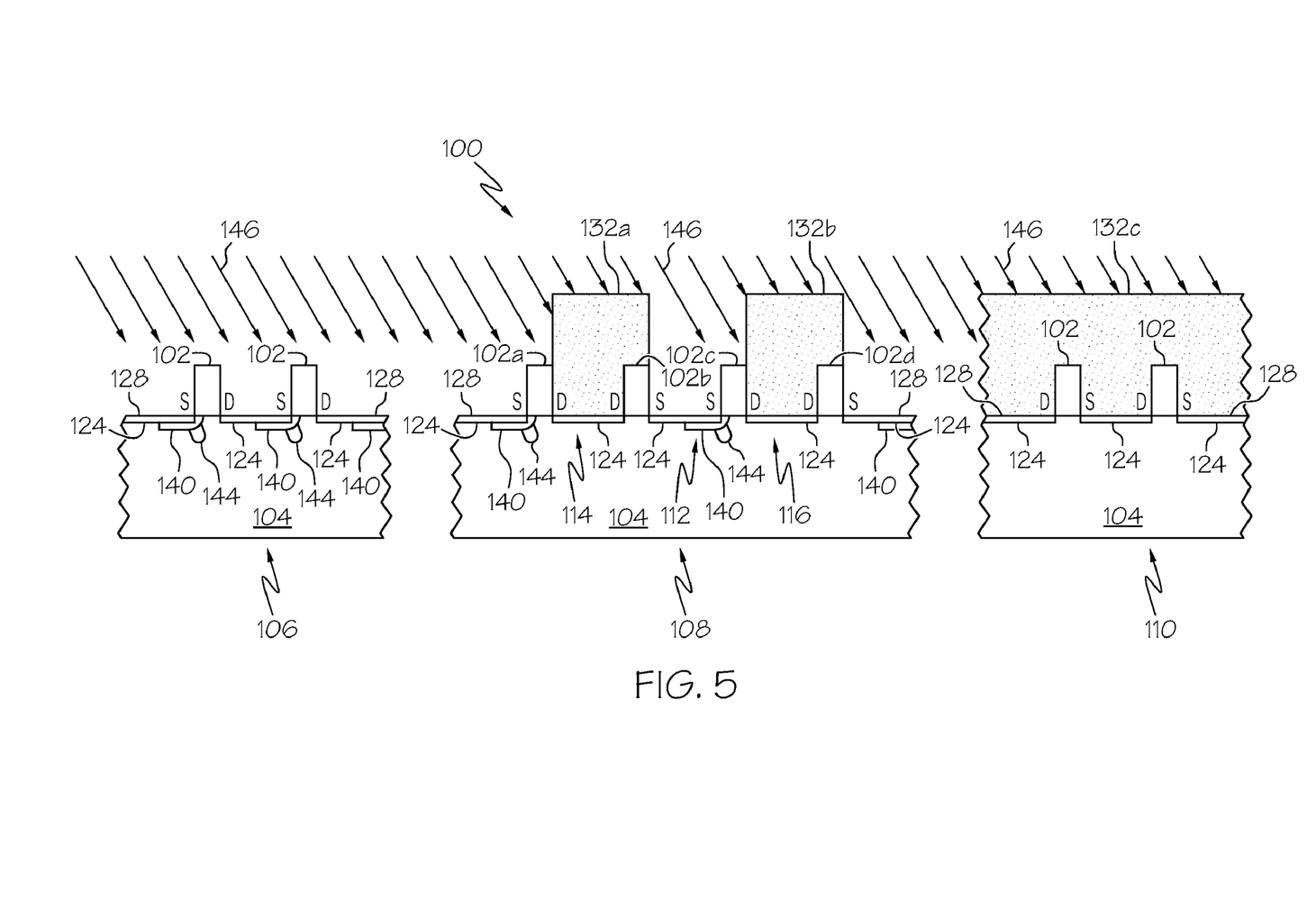

Although other fabrication steps or sub-processes may be performed after creating the heavy dose extension implants 140, this example continues by forming halo implants 144 in the semiconductor material 104. FIG. 5 depicts the state of the device structure 100 during the creation of the halo implants 144. As shown in FIG. 5, the halo implants 144 are formed in or near some of the channel regions of the device structure 100.

For the illustrated embodiment, the halo implants 144 are formed by implanting appropriate conductivity-determining ions of an impurity species into the semiconductor material 104, using the gate structures 102 and the patterned mask 132 together as an implantation mask. Notably, the same patterned mask 132 is used to create the heavy dose extension implants 140 and the halo implants 144, and the patterned mask 132 need not be removed or replaced to form the halo implants 144. In FIG. 5, the arrows 146 (only three of which are specifically labeled) represent the ions that are implanted into the semiconductor material 104 during this step. Notably, the halo implants 144 are created by bombarding the device structure 100 with the ions oriented at a tilted angle relative to the exposed surface 128 of the semiconductor material 104 (or relative to any appropriate reference surface of the semiconductor material 104). Equivalently, the tilted angle could be measured relative to the vertical sidewalls of the gate structures 102. In practice, the implantation angle of the ions during this step is relatively high as measured from the sidewalls, e.g., within the range of twenty to thirty degrees. Notably, the ions are directed at an angle toward the gate structures (as depicted in FIG. 5) such that the ions are implanted beyond the source regions and extend into some of the channel regions. Thus, the tilt angle associated with the halo implants 144 is significantly higher than the tilt angle associated with the heavy dose extension implants 140.

For NMOS transistors, the halo implants 144 can be formed by implanting phosphorus ions into the semiconductor material 104. For PMOS transistors, the heavy dose extension implants 140 can be formed by implanting boron ions into the semiconductor material 104. The implant dose for typical halo implants 144 will be within the range of about $1 \times 10^{13}$ cm$^{-3}$ to $5 \times 10^{14}$ cm$^{-3}$.

Referring to the left section 106 of the device structure 100, the left-to-right alternating arrangement of source regions and drain regions results in asymmetric halo implants 144. The gate structures 102 of the left section 106 serve as "shadowing" features that block the tilted ion implants from reaching the drain regions of the left section 106. Thus, even though the patterned mask 132 includes no features overlying the left section 106, the desired halo implant asymmetry is achieved. Referring to the right section 110 of the device structure 100, however, the right-to-left alternating arrangement of source regions and drain regions requires protection by the section of the patterned mask 132c. Without the section of the patterned mask 132c, the drain regions of the right section 110 would be implanted during the halo implantation step. This explains the need for the section of the patterned mask 132c, which completely covers the right section 110. Referring to the middle section 108 of the device structure 100, the shared source region 112 (and other source regions) remain exposed, while the shared drain regions 114/116 are protected by the patterned mask 132.

For the illustrated example, the arrangement, orientation, and configuration of the patterned mask 132 facilitates halo implanting for all "source left" devices during this step. At the same time, the patterned mask 132 inhibits halo implanting of "source right" devices. FIG. 5 illustrates this asymmetric formation of the halo implants 144. It should be noted that the illustrated halo implant profile only indicates locations that are effective for device characteristics.

Although this description assumes that the halo implants 144 are formed after the heavy dose extension implants 140, the order of these two steps is arbitrary. In other words, the halo implants 144 could be formed prior to the formation of the heavy dose extension implants 140, resulting in an equivalent structure and implant arrangement.

Figure 6:
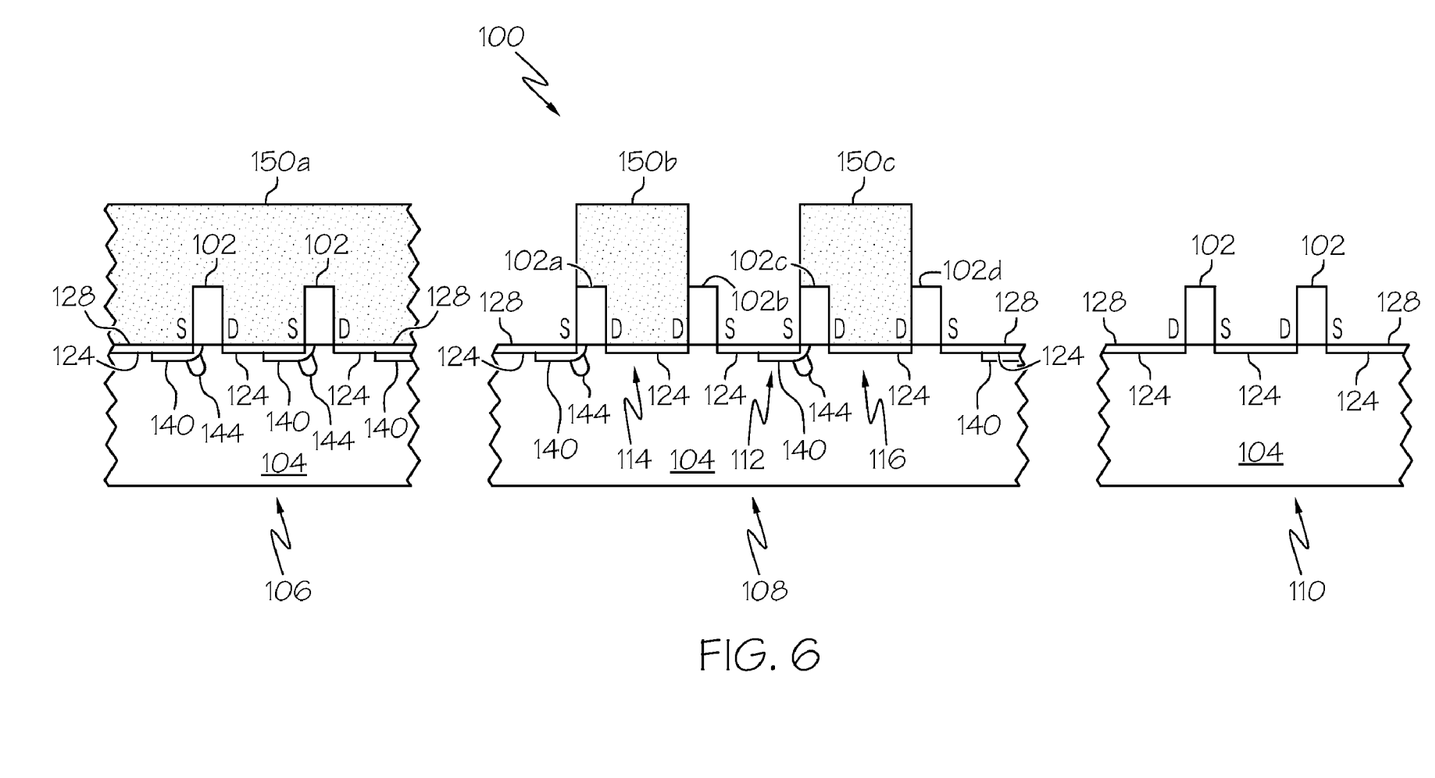

Although other fabrication steps or sub-processes may be performed after creating the halo implants 144, this example continues by removing the patterned mask 132, preparing the device structure 100 as needed, and forming a second patterned mask 150 that overlies selective portions of the semiconductor material 104 (see FIG. 6). The second patterned mask 150 serves to protect certain areas and regions of the semiconductor material 104, while leaving other areas and regions substantially (or completely) exposed. The second patterned mask 150 may be formed as described above for the patterned mask 132. Like the patterned mask 132, the second patterned mask 150 is formed such that its height above the exposed surface 128 of the semiconductor material 104 is no greater than 250 nm. Notably, the second patterned mask 150 is distinct from and different than the first patterned mask 132 and is distinct from and different than any well mask that is used to create the light dose extension implants 124.

FIG. 6 depicts device structure 100 after the second patterned mask 150 has been developed. For the illustrated example, a section of the patterned mask 150a completely covers the left section 106 of the device structure 100, but the right section 110 of the device structure 100 remains fully exposed. Moreover, the second patterned mask 150 is suitably arranged to protect the shared drain regions of the semiconductor material 104, and to leave the shared source regions of the semiconductor material 104 substantially exposed. In certain embodiments, the second patterned mask 150 covers most (if not all) of the shared drain regions 114/116, at least partially covers the gate structure 102a, and at least partially covers the gate structure 102c. In this example, a section of the second patterned mask 150b completely covers the shared drain region 114 with mask material, and a section of the second patterned mask 150c completely covers the shared drain region 116 with mask material. Notably, the second patterned mask 150 can be arranged such that the shared source region 112 is completely exposed. For the illustrated embodiment, the section of the second patterned mask 150b fully protects the shared drain region 114, completely covers the gate structure 102a, and covers little or no portion of the gate structure 102b. Similarly, the section of the second patterned mask 150c fully protects the shared drain region 116, completely covers the gate structure 102c, and covers little or no portion of the gate structure 102d. This particular arrangement and orientation of the second patterned mask 150 is not arbitrary. Rather, the second patterned mask 150 is arranged in this manner to maximize the exposed space between the mask material such that subsequent titled ion implants for the source regions can reach the desired locations and areas of the semiconductor material 104, while preventing those tilted ion implants from reaching the drain regions.

Figure 7:
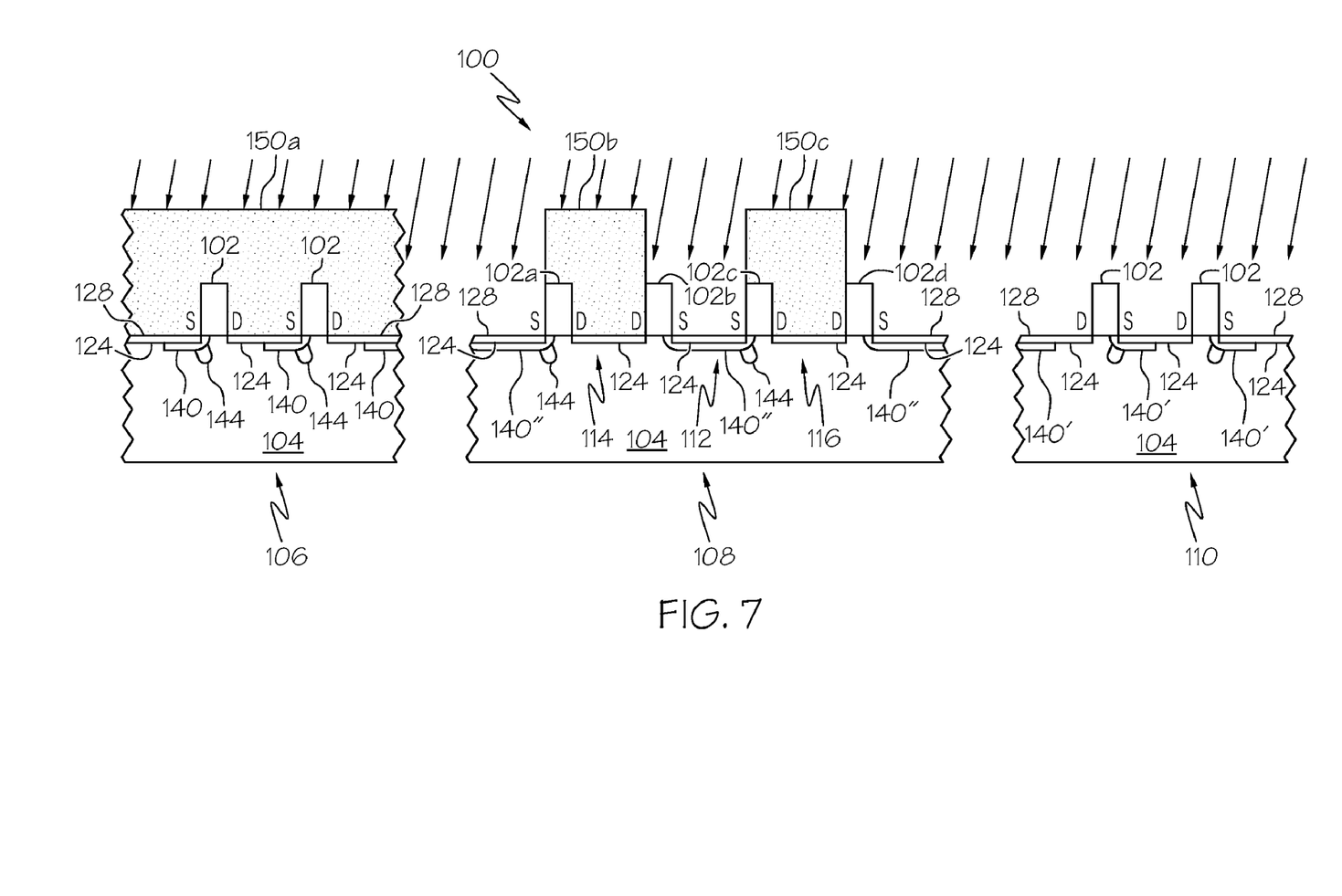

After creating the second patterned mask 150, this example continues by forming additional heavy dose extension implants in the semiconductor material 104, and by forming additional halo implants in the semiconductor material 104, using the gate structures 102 and the second patterned mask 150 as the implantation mask. FIG. 7 depicts the state of the device structure 100 during the creation of the additional heavy dose extension implants. This step is similar to that described above with reference to FIG. 4, however, the titled ion bombardment is oriented in the opposite direction. In other words, the tilt angle is preferably the same (e.g., within the range of six to eleven degrees), but the ions are directed toward the right side of the gate structures 102 (as depicted in FIG. 7) rather than toward the left side of the gate structures 102 (as depicted in FIG. 4). Consequently, this ion implantation step forms heavy dose extension implants for the "source right" devices in the device structure 100. However, "source left" transistors do not receive heavy dose extension implants at this point in the process. The creation of these additional heavy dose extension implants is decoupled from the creation of the light dose extension implants 124, and is decoupled from the creation of the initial heavy dose extension implants. In this regard, different ion implantation masks are used to create the light dose extension implants, the initial heavy dose extension implants, and the additional heavy dose extension implants, and three different ion implantation steps are executed.

Referring to the right section 110 of the device structure 100, the right-to-left alternating arrangement of source regions and drain regions results in asymmetric heavy dose extension implants 140' for the "source right" devices. The gate structures 102 of the right section 110 serve as "shadowing" features that block the tilted ion implants from reaching the drain regions of the right section 110. Thus, even though the second patterned mask 150 includes no features overlying the right section 110, the desired asymmetry is achieved. Referring to the left section 106 of the device structure 100, however, the left-to-right alternating arrangement of source regions and drain regions requires protection by the section of the second patterned mask 150a. Without the section of the second patterned mask 150a, the drain regions of the left section 106 would be implanted during this second heavy dose implantation step. This explains the need for the section of the second patterned mask 150a, which completely covers the left section 106.

Referring to the middle section 108 of the device structure 100, the shared source region 112 (and other source regions) remain exposed, while the shared drain regions 114/116 are protected by the second patterned mask 150. FIG. 7 depicts an ideal second patterned mask 150 that completely covers shared drain regions 114/116, completely covers gate structures 102a/102c, and does not overlap any portion of gate structures 102b/102d. This ideal configuration and height of the second patterned mask 150 allows the tilted ion bombardment to reach the desired source regions of the semiconductor material 104, as depicted in FIG. 7. Notably, even if 32 nm node technology is used to create the device structure 100, the second patterned mask 150 exposes the full available gate-to-gate space (e.g., 90 nm) above the shared source region 112.

In practice, this follow-up heavy dose extension implantation step may form shared heavy dose extension implants 140" in the shared source regions. In other words, some of the previously formed heavy dose extension implants 140 may "blend" with some of the heavy dose extension implants created during this follow-up implantation step. The actual realization of the heavy dose extension implants can be conceptualized and visualized in any convenient manner, and the depiction in FIG. 7 is presented for ease of description. In this regard, FIG. 7 depicts shared heavy dose extension implants 140" residing in the middle section 108 of the device structure 100. In certain situations, the profile of the shared heavy dose extension implants 140" need not be as depicted in FIG. 7. Moreover, the heavy dose extension implant profile in a shared source region could be more akin to two separate and distinct implant zones or areas.

Figure 8:
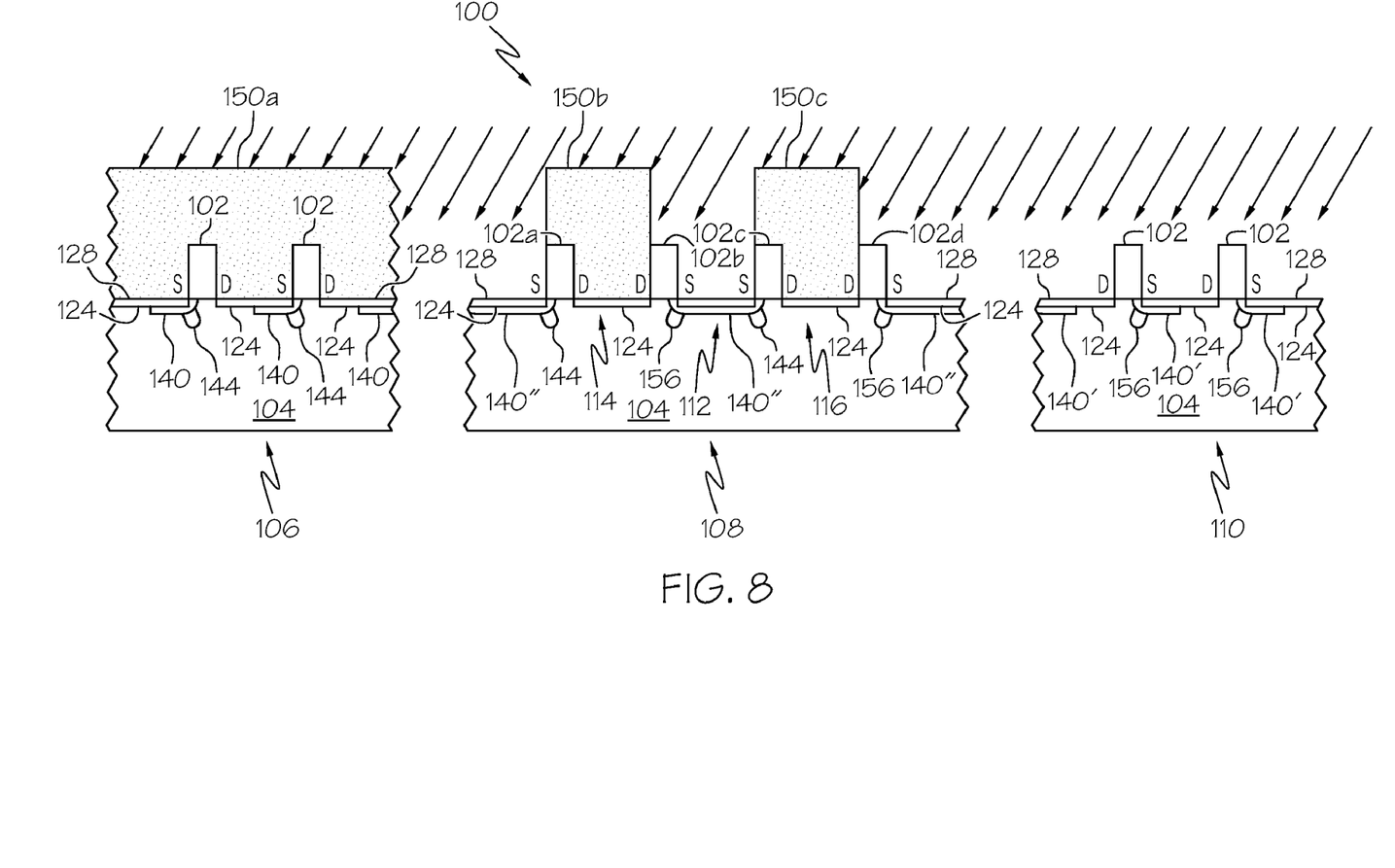

FIG. 8 depicts the state of the device structure 100 during the creation of the additional halo implants. It should be noted that the illustrated halo implant profile only indicates locations that are effective for device characteristics. This step is similar to that described above with reference to FIG. 5, however, the titled ion bombardment is oriented in the opposite direction. In other words, the tilt angle is preferably the same (e.g., within the range of twenty to thirty degrees), but the ions are directed toward the right side of the gate structures 102 (as depicted in FIG. 8) rather than toward the left side of the gate structures 102 (as depicted in FIG. 5). Consequently, this ion implantation step forms halo implants 156 for the "source right" devices in the device structure 100. However, "source left" transistors do not receive halo implants at this point in the process.

Notably, the second patterned mask 150 is also used to create the halo implants 156, and the second patterned mask 150 need not be removed or replaced before forming the halo implants 156. Referring to the right section 110 of the device structure 100, the right-to-left alternating arrangement of source regions and drain regions results in asymmetric halo implants 156. The gate structures 102 of the right section 110 serve as "shadowing" features that block the tilted halo implants from reaching the drain regions of the right section 110. Thus, even though the second patterned mask 150 includes no features overlying the right section 110, the desired halo implant asymmetry is achieved. Referring to the left section 106 of the device structure 100, however, the left-to-right alternating arrangement of source regions and drain regions requires protection by the section of the second patterned mask 150a. Without the section of the second patterned mask 150a, the drain regions of the left section 106 would be implanted during this second halo implantation step. This explains the need for the section of the second patterned mask 150a, which completely covers the left section 106. Referring to the middle section 108 of the device structure 100, the shared source region 112 (and other source regions) remain exposed, while the shared drain regions 114/116 are protected by the second patterned mask 150.

Figure 9:
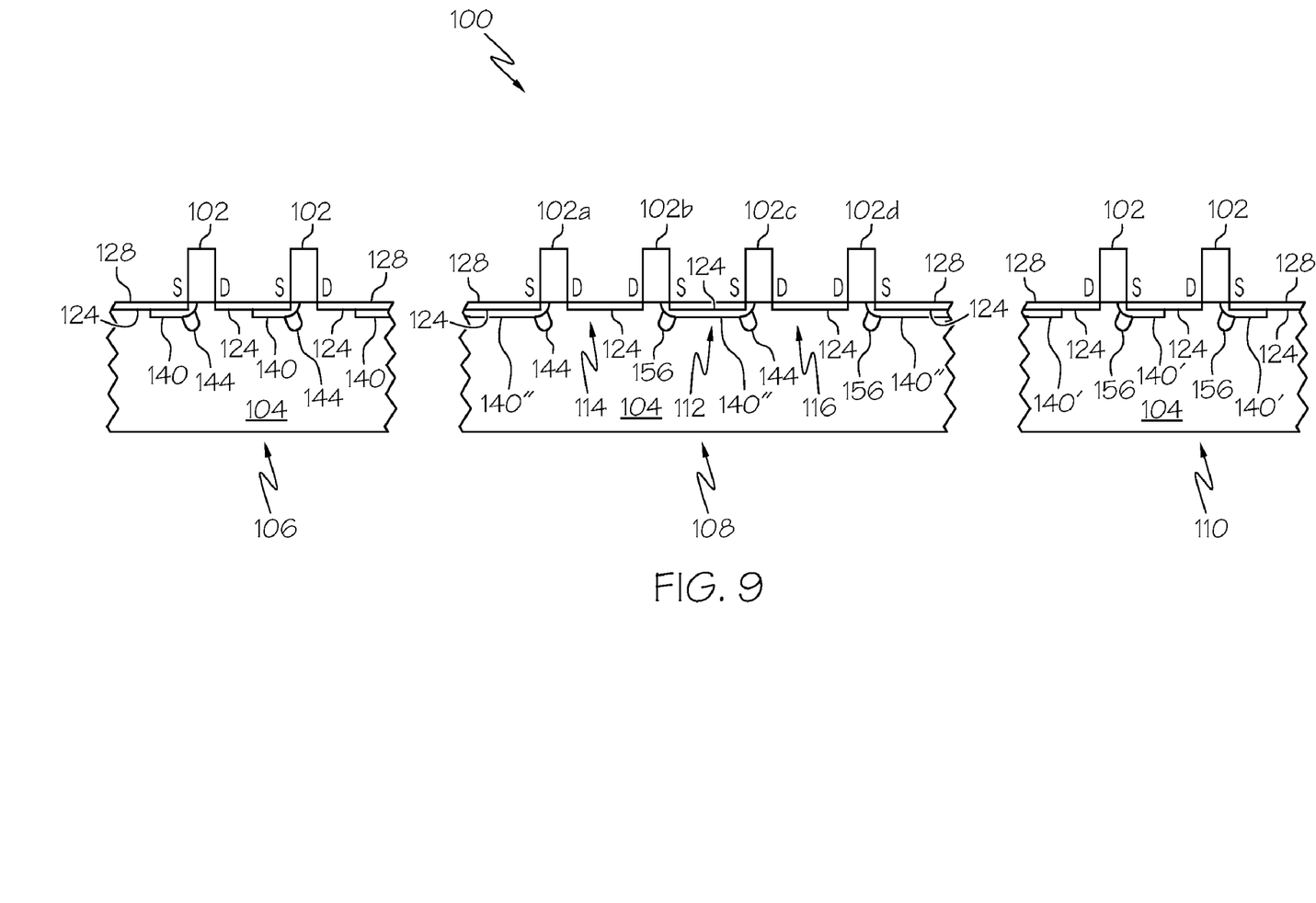

After the halo implants 156 and the additional heavy dose extension implants are formed, the second patterned mask 150 is removed and the device structure 100 can be cleaned or otherwise prepared for subsequent process steps. FIG. 9 depicts the state of the device structure 100 after the second patterned mask 150 has been removed. Thereafter, any number of known process steps can be performed to complete the fabrication of the transistor devices. Such additional process steps may include, for example: sidewall spacer formation; deep source and drain implants; silicide contact formation; and back end process steps. For the sake of brevity, these process steps and the resulting transistor devices are not shown or described here.

Figure 10:
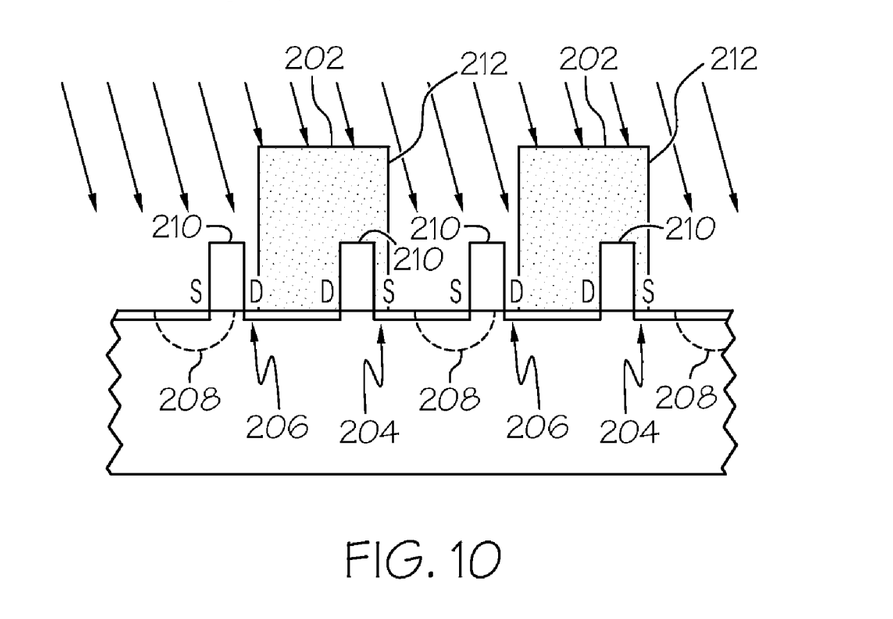
FIGS. 10-11 are cross sectional views that illustrate how the fabrication process of FIGS. 1-9 can accommodate slight shifting of a desired photolithographic mask.

The arrangement of the patterned mask 132 and the second patterned mask 150 facilitates the formation of asymmetric transistor devices using small node technologies (32 nm and beyond). Practical fabrication tolerances, however, might result in the shifting of the patterned mask 132 and/or the second patterned mask 150, i.e., the mask features may be offset relative to the ideal arrangement shown in the figures. Nonetheless, the process described herein is immune to such shifting. In this regard, FIG. 10 is a cross sectional view that illustrates how the fabrication process of FIGS. 1-9 can accommodate shifting (to the right) of a desired photolithographic mask. FIG. 10 represents a right-shifted version of the ideal patterned mask 132 shown in FIG. 5. The right-shifted mask 202 may represent a worst case scenario that corresponds to a shift of about 25 nm. The shift results in overprotection of two "source right" regions 204, and slight exposure of two "drain right" regions 206. Nonetheless, the right-shifted mask 202 still accommodates the formation of heavy dose extension implants and/or halo implants in the desired "source-left" regions 208. The implants are possible because enough space still remains between the gate structures 210 and the right sidewalls 212 of the right-shifted mask 202. Moreover, the two "drain right" regions 206 remain relatively immune to tilted implants due to the narrow width of the exposed gap, and due to the shadowing (caused by the gate structures 210) of the angled ion implantation.

Figure 11:
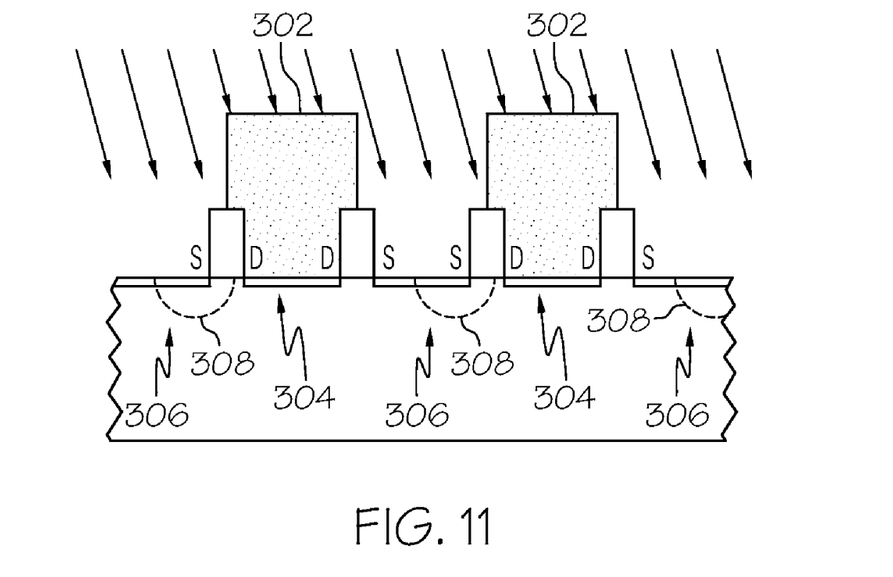

FIG. 11 is a cross sectional view that illustrates how the fabrication process of FIGS. 1-9 can accommodate shifting (to the left) of a desired photolithographic mask. FIG. 11 represents a left-shifted version of the ideal patterned mask 132 shown in FIG. 5. The left-shifted mask 302 may represent a worst case scenario that corresponds to a shift of about 25 nm. For this example, the left-shifted mask 302 completely covers the shared drain regions 304, and leaves the shared source regions 306 fully exposed. Consequently, the left-shifted mask 302 still accommodates the formation of heavy dose extension implants and/or halo implants in the desired "source-left" regions 308.

The process described above with reference to FIGS. 1-9 assumes that the wafer includes different arrangements of devices that calls for more than one patterned mask. In particular, the above example assumes that at least one section of the device structure contains devices with shared source regions and shared drain regions, and that at least one section of the device structure contains devices with alternating source and drain regions. Accordingly, two different patterned masks are utilized to create asymmetric implants in all devices on the wafer. If, however, the wafer only includes an arrangement of devices having shared source regions and shared drain regions, then multiple patterned masks need not be used to form the heavy dose extension implants and halo implants. For example, a patterned mask having the features depicted in FIG. 11 could be intentionally created on a device structure having shared source regions and shared drain regions. The features of such a patterned mask may be suitably arranged such that tilted left and tilted right ion implants (for heavy dose extension implants and/or halo implants) can reach the desired source regions. In other words, under certain circumstances the various ion bombardment steps can be performed using only one patterned mask.

The process described above with reference to FIGS. 1-9 also assumes that both heavy dose extension implants and halo implants are created. In certain embodiments, however, it may be desirable to form the asymmetric heavy dose extension implants without forming halo implants. On the other hand, it may be desirable to form asymmetric halo implants without forming heavy dose extension implants. Transistor devices can be fabricated in accordance with these different variations as needed to suit the needs of the particular application.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating semiconductor devices, the method comprising:
fabricating a device structure comprising a semiconductor material and a plurality of gate structures formed overlying the semiconductor material;
creating light dose extension implants in the semiconductor material, using the plurality of gate structures as a first implantation mask, by bombarding the device structure with ions at a non-tilted angle relative to an exposed surface of the semiconductor material;
forming a patterned mask overlying the semiconductor material, the patterned mask being arranged to protect shared drain regions of the semiconductor material and to leave shared source regions of the semiconductor material substantially exposed;
producing heavy dose extension implants in the semiconductor material, using the plurality of gate structures and the patterned mask together as a second implantation mask, by bombarding the device structure with ions at a tilted angle relative to the exposed surface of the semiconductor material, and toward the plurality of gate structures; and
forming halo implants in the semiconductor material, using the second implantation mask, by bombarding the device structure with ions at a second tilted angle relative to the exposed surface of the semiconductor material, and toward the plurality of gate structures.

2. The method of claim 1, wherein:
each of the plurality of gate structures has sidewalls;
the step of producing heavy dose extension implants comprises bombarding the device structure with ions at a relatively low angle, as measured from the sidewalls; and
the step of forming halo implants comprises bombarding the device structure with ions at a relatively high angle, as measured from the sidewalls.

3. The method of claim 1, wherein:
the step of creating light dose extension implants comprises implanting a relatively low percentage of a total extension implant dose; and
the step of producing heavy dose extension implants comprises implanting a relatively high percentage of the total extension implant dose.

4. The method of claim 3, wherein:
the step of creating light dose extension implants comprises implanting between 10% to 40% of the total extension implant dose; and
the step of producing heavy dose extension implants comprises implanting between 60% to 90% of the total extension implant dose.

5. The method of claim 1, wherein the step of forming the patterned mask comprises completely covering the shared drain regions with mask material.

6. The method of claim 1, wherein the step of forming the patterned mask comprises completely exposing the shared source regions.

7. The method of claim 1, wherein each shared source region corresponds to a respective region of the semiconductor material underlying a space between two adjacent ones of the plurality of gate structures.

8. The method of claim 1, wherein each shared drain region corresponds to a respective region of the semiconductor material underlying a space between two adjacent ones of the plurality of gate structures.

9. A method of fabricating semiconductor devices, the method comprising:
providing a device structure comprising a semiconductor material and a plurality of gate structures formed overlying the semiconductor material;
creating light dose extension implants in the semiconductor material, using the plurality of gate structures as a first implantation mask, by bombarding the device structure with ions at a non-tilted angle relative to a reference surface of the semiconductor material;
forming a patterned mask overlying the semiconductor material, the patterned mask being arranged to protect shared drain regions of the semiconductor material and to leave shared source regions of the semiconductor material substantially exposed;
forming halo implants in the semiconductor material, using the plurality of gate structures and the patterned mask together as a second implantation mask, by bombarding the device structure with ions at a tilted angle relative to the reference surface of the semiconductor material, and toward the plurality of gate structures; and
producing heavy dose extension implants in the semiconductor material, using the second implantation mask, by bombarding the device structure with ions at a second tilted angle relative to the reference surface of the semiconductor material, and toward the plurality of gate structures.

10. The method of claim 9, wherein:
each of the plurality of gate structures has sidewalls;
the step of forming halo implants comprises bombarding the device structure with ions at a relatively high angle, as measured from the sidewalls; and
the step of producing heavy dose extension implants comprises bombarding the device structure with ions at a relatively low angle, as measured from the sidewalls.

11. The method of claim 9, wherein:
the step of creating light dose extension implants comprises implanting a relatively low percentage of a total extension implant dose; and
the step of producing heavy dose extension implants comprises implanting a relatively high percentage of the total extension implant dose.

12. A method of fabricating a semiconductor device having adjacent transistor devices that share active regions, the method comprising:
providing a device structure comprising a semiconductor material, a plurality of gate structures formed overlying the semiconductor material, a shared source region of the semiconductor material, which underlies a first space defined between a first gate structure of the plurality of gate structures and a second gate structure of the plurality of gate structures, and a shared drain region of the semiconductor material, which underlies a second space defined between the second gate structure and a third gate structure of the plurality of gate structures, the second gate structure being adjacent to the first gate structure, and the third gate structure being adjacent to the second gate structure;
implanting a relatively light impurity dose into the semiconductor material while using the plurality of gate structures as a first implantation mask, resulting in light dose extension implants in the shared source region and in the shared drain region;
protecting the shared drain region with a first patterned mask that leaves the shared source region substantially exposed;

implanting a relatively high impurity dose into the semiconductor material while using the plurality of gate structures and the first patterned mask together as a second implantation mask, by bombarding the shared source region with ions of an impurity species at a first tilted angle and toward the second gate structure, resulting in a first heavy dose extension implant in the shared source region; and implanting another relatively high impurity dose into the semiconductor material while using the second implantation mask, by bombarding the shared source region with ions of the impurity species at a second tilted angle and toward the first gate structure, resulting in a second heavy dose extension implant in the shared source region.

13. The method of claim 12, further comprising the step of forming a halo implant in the semiconductor material while using the second implantation mask, by bombarding the shared source region with ions at a second tilted angle and toward the second gate structure.

14. The method of claim 12, wherein the step of protecting the shared drain region comprises forming the first patterned mask such that it covers most of the shared drain region and such that it at least partially covers the third gate structure, and wherein the method further comprises:

removing the first patterned mask after implanting the relatively high impurity dose into the semiconductor material;

thereafter, forming a second patterned mask such that it covers at least eighty percent of the shared drain region and such that it at least partially covers the second gate structure; and thereafter, implanting a relatively high impurity dose into the semiconductor material while using the plurality of gate structures and the second patterned mask together as a third implantation mask, by bombarding the shared source region with ions of the impurity species at a second tilted angle and toward the first gate structure, resulting in a second heavy dose extension implant in the shared source region.

15. The method of claim 14, wherein:

the step of protecting the shared drain region comprises forming the first patterned mask such that it completely covers the shared drain region and such that it completely covers the third gate structure; and the step of forming the second patterned mask comprises forming the second patterned mask such that it completely covers the shared drain region and such that it completely covers the second gate structure.

16. The method of claim 14, further comprising:

forming a first halo implant in the semiconductor material while using the second implantation mask, by bombarding the shared source region with ions at a third tilted angle and toward the second gate structure; and forming a second halo implant in the semiconductor material while using the third implantation mask, by bombarding the shared source region with ions at a fourth tilted angle and toward the first gate structure.

17. The method of claim 12, wherein:

the step of implanting the relatively light impurity dose comprises implanting less than half of a total extension implant dose; and the step of implanting the relatively high impurity dose comprises implanting the remaining amount of the total extension implant dose.

* * * * *